(12) United States Patent
Huang et al.

(10) Patent No.: US 9,728,592 B2
(45) Date of Patent: Aug. 8, 2017

(54) PIXEL STRUCTURE

(71) Applicant: AU OPTRONICS CORPORATION, Hsin-chu (TW)

(72) Inventors: Chen-Shuo Huang, Hsin-chu (TW); Chih-Pang Chang, Hsin-chu (TW); Hung-Wei Li, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/065,213

(22) Filed: Mar. 9, 2016

(65) Prior Publication Data

US 2017/0040394 A1 Feb. 9, 2017

(51) Int. Cl.
*H01L 27/32* (2006.01)
*H01L 27/12* (2006.01)

(52) U.S. Cl.
CPC ...... *H01L 27/3248* (2013.01); *H01L 27/1225* (2013.01)

(58) Field of Classification Search
CPC ............. H01L 27/3248; H01L 27/1225; H01L 27/3246; H01L 27/3244; H01L 27/14609
See application file for complete search history.

(56) References Cited

U.S. PATENT DOCUMENTS

| | | | |
|---|---|---|---|
| 6,372,560 B1 * | 4/2002 | Jen | G02F 1/1368 257/59 |
| 7,142,260 B2 | 11/2006 | Yang | |
| 7,675,582 B2 | 3/2010 | Luo et al. | |
| 7,745,825 B2 | 6/2010 | Ting | |
| 7,773,139 B2 | 8/2010 | den Boer et al. | |
| 7,985,636 B2 * | 7/2011 | Yeh | H01L 27/1288 257/E21.413 |
| 8,054,304 B2 * | 11/2011 | Lin | G06F 3/0412 257/87 |
| 8,426,870 B2 * | 4/2013 | Kanegae | H01L 27/3248 257/40 |
| 8,575,612 B2 | 11/2013 | Lee et al. | |
| 8,853,704 B2 * | 10/2014 | Lee | H01L 27/1225 257/72 |

(Continued)

*Primary Examiner* — John C Ingham
*Assistant Examiner* — Gustavo Ramallo
(74) *Attorney, Agent, or Firm* — Tim Tingkang Xia, Esq.; Locke Lord LLP

(57) ABSTRACT

A pixel structure includes a metal oxide semiconductor layer, a first insulating layer, a second insulating layer, a first conductive layer, a passivation layer, a second conductive layer and a pixel electrode. The metal oxide semiconductor layer includes a second semiconductor pattern. The first insulating layer includes a first capacitance dielectric pattern disposed on the second semiconductor pattern. The second insulating layer includes a second capacitance dielectric pattern disposed on the first capacitance dielectric pattern. The first conductive layer includes a electrode pattern disposed on the second capacitance dielectric pattern. The passivation layer covers the first conductive layer. The second conductive layer includes a second electrode disposed on the passivation layer. The second electrode is electrically connected to the second semiconductor pattern. The second electrode is disposed to overlap the electrode pattern. The second semiconductor pattern, the electrode pattern and the second electrode form a storage capacitor.

20 Claims, 15 Drawing Sheets

(56) References Cited

U.S. PATENT DOCUMENTS

| | | | | |
|---|---|---|---|---|
| 9,202,926 B2* | 12/2015 | Kishi | .................. | H01L 29/7869 |
| 2003/0127652 A1* | 7/2003 | Park | .................... | H01L 27/3244 |
| | | | | 257/72 |
| 2003/0137255 A1* | 7/2003 | Park | ..................... | G09G 3/3233 |
| | | | | 315/169.3 |
| 2004/0012028 A1* | 1/2004 | Park | .................... | H01L 27/3244 |
| | | | | 257/88 |
| 2006/0065894 A1* | 3/2006 | Jung | ................. | H01L 29/78621 |
| | | | | 257/66 |
| 2006/0091399 A1* | 5/2006 | Lee | ......................... | H01L 27/12 |
| | | | | 257/72 |
| 2008/0251790 A1* | 10/2008 | Cheng | ............... | G02F 1/136213 |
| | | | | 257/59 |
| 2009/0085037 A1* | 4/2009 | Chen | .................... | H01L 27/124 |
| | | | | 257/71 |
| 2011/0140113 A1* | 6/2011 | Park | .................... | H01L 27/1214 |
| | | | | 257/59 |
| 2012/0037906 A1* | 2/2012 | Ryu | .................... | H01L 27/1225 |
| | | | | 257/57 |
| 2014/0061632 A1* | 3/2014 | Lee | .................. | H01L 29/78633 |
| | | | | 257/43 |
| 2015/0069356 A1* | 3/2015 | Lee | ..................... | H01L 51/5206 |
| | | | | 257/40 |
| 2015/0340384 A1* | 11/2015 | Lin | ..................... | H01L 27/3276 |
| | | | | 257/43 |

\* cited by examiner

PIXEL STRUCTURE

CROSS-REFERENCE TO RELATED APPLICATIONS

This application claims the priority to and the benefit of, pursuant to 35 U.S.C. §119(a), Taiwanese Patent Application No. 104125616, filed Aug. 6, 2015, the content of which is incorporated herein in its entirety by reference.

TECHNICAL FIELD

The disclosure relates generally to a pixel structure, and in particular to a pixel structure provided with at least two storage capacitors.

BACKGROUND

A flat panel display has the advantages of being small, lightweight, low in power consumption, and so forth, and therefore the flat panel display has already replaced the Cathode Ray Tube, or CRT, to become the trend of a new generation of displays. However, along with the increasingly mature development of flat panel display technologies, users have increasingly higher requirements for the display quality of flat panel displays, in addition to the size, weight, and so forth, and the display quality of flat panel displays is highly related to the design of their pixel structures.

Generally speaking, a pixel structure includes an active element, a pixel electrode, and a storage capacitor. The active element is used as a switch component of the pixel structure. The pixel electrode is used for providing operation voltage for driving a display medium. The storage capacitor is used for holding the operation voltage of the pixel electrode. If the storage capacitance of the storage capacitor is insufficient, the operation voltage of the pixel electrode cannot be maintained till the next time the active element is started. In this case, abnormal display may be caused by the condition that the operation voltage of the pixel electrode is lower than a predetermined value. Therefore, in order to maintain a certain display quality, the storage capacitor in the pixel structure must have a sufficient capacitance value to ensure maintenance of the operation voltage.

One technical method which ensures the storage capacitor to have a sufficient capacitance value is to provide an electrode of the storage capacitor having sufficient area. However, the electrode of the storage capacitor is generally made of non-transparent materials, and when the area of the electrode of the storage capacitor increases, the aperture ratio of the pixel electrode becomes smaller. Thus, the display quality is deteriorated due to the insufficient brightness of the flat panel display. Therefore, one of the problems to be solved is to effectively increase the capacitance value of the storage capacitor while maintaining a good aperture ratio of the pixel electrode.

SUMMARY OF THE INVENTION

One aspect of the invention provides a pixel structure, which can effectively increase capacitance value of a storage capacitor while maintaining a good aperture ratio.

In certain embodiments, the pixel structure includes a metal oxide semiconductor layer, a first insulating layer, a second insulating layer, a first conductive layer, a passivation layer, a second conductive layer, and a pixel electrode. The metal oxide semiconductor layer includes a first semiconductor pattern and a second semiconductor pattern, wherein the first semiconductor pattern includes a first doping region, a second doping region, and a channel region, and the first doping region and the second doping region are disposed on the two sides of the channel region, respectively. The second semiconductor pattern includes a contact portion and an electrode portion. The first insulating layer includes a first gate insulation pattern and a first capacitance dielectric pattern, the first gate insulation pattern is disposed on the first semiconductor pattern, and the first capacitance dielectric pattern is disposed on the second semiconductor pattern. The second insulating layer includes a second gate insulation pattern and a second capacitance dielectric pattern, the second gate insulation pattern is disposed on the first gate insulation pattern, and the second capacitance dielectric pattern is disposed on the first capacitance dielectric pattern. The first conductive layer includes a gate and an electrode pattern, the gate is disposed on the second gate insulation pattern, and the electrode pattern is disposed on the second capacitance dielectric pattern. The passivation layer covers the metal oxide semiconductor layer and the first conductive layer and is provided with a first opening through which the first doping region of the first semiconductor pattern is exposed, a second opening through which the second doping region of the first semiconductor pattern is exposed, a third opening through which the contact portion is exposed, and a fourth opening through which the electrode pattern is exposed. The second conductive layer is disposed on the passivation layer and includes a first electrode, a second electrode, and a second electrode connected with the second electrode extending portion, the first electrode is electrically connected with the first doping region of the first semiconductor pattern through the first opening, and the second electrode is electrically connected with the second doping region of the first semiconductor pattern through the second opening, and the second electrode extending portion is electrically connected with the contact portion of the second semiconductor pattern through the third opening. The second electrode extending portion is disposed to partially overlap the electrode pattern. The gate, the first semiconductor pattern, the first electrode, and the second electrode constitute the active element, the second semiconductor pattern partially overlaps the electrode pattern and is coupled with the electrode pattern to constitute a first storage capacitor, and the electrode pattern partially overlaps the second electrode extending portion and is coupled with the second electrode extending portion to constitute a second storage capacitor. The pixel electrode is electrically connected with the second electrode.

In a further aspect, a pixel structure includes a metal oxide semiconductor layer, a first insulating layer, a second insulating layer, a conductive pattern, a first conductive layer, a passivation layer, a second conductive layer and a pixel electrode. The metal oxide semiconductor layer includes a first semiconductor pattern and a second semiconductor pattern, wherein the first semiconductor pattern includes a first doping region, a second doping region and a channel region. The first doping region and the second doping region are disposed on the two sides of the channel region, and the second semiconductor pattern includes a contact portion and an electrode portion. The first insulating layer includes a first gate insulation pattern and a first capacitance dielectric pattern, the first gate insulation pattern is disposed on the first semiconductor pattern, and the first capacitance dielectric pattern is disposed on the second semiconductor pattern. The second insulating layer includes a second gate insulation pattern and a second capacitance dielectric pattern, the second gate insulation pattern is disposed on the first gate insulation pattern, and the second capacitance dielectric pattern is disposed on the first capacitance dielectric pattern. The conductive pattern is disposed above the second semiconductor pattern and is clamped between the first capacitance dielectric pattern and the second capacitance dielectric pattern. The first conductive layer includes a gate and an electrode pattern, the gate is disposed on the second gate insulation pattern, and the electrode pattern is disposed on the second capacitance dielectric pattern. The first doping region and the second doping of the first conductive layer are exposed, and the contact portion of the second semiconductor layer is exposed. The passivation layer covers the metal oxide semiconductor layer and the first conductive layer and is provided with a first opening through which the first doping region of the first semiconductor pattern is exposed, a second opening through which the second doping region of the first semiconductor pattern is exposed, a third opening through which the contact portion is exposed, and a fourth opening through which the first electrode is exposed. The second conductive layer is disposed on the passivation layer and includes a first electrode and a second electrode, the first electrode is electrically connected with the first doping region of the first semiconductor pattern through the first opening, and the second electrode is electrically connected with the second doping region of the first semiconductor pattern through the second opening. The gate, the first semiconductor pattern, the first electrode and the second electrode constitute the active element, the second electrode is electrically connected with the contact portion of the second semiconductor pattern through the third opening, the second semiconductor pattern partially overlaps with the conductive pattern and is coupled with the conductive pattern to constitute one storage capacitor, and the conductive pattern partially overlaps with the electrode pattern and is coupled with the electrode pattern to constitute another storage capacitor. The pixel electrode is electrically connected with the second electrode.

In a further aspect, a layered structure usable for a pixel structure includes: a metal oxide semiconductor layer including a first semiconductor pattern and a second semiconductor pattern, where the first semiconductor pattern includes a first doping region, a second doping region and a channel region, the first doping region and the second doping region are disposed respectively on two sides of the channel region, and the second semiconductor pattern includes a contact portion and an electrode portion; a first conductive layer including a gate and an electrode pattern, where the gate is disposed above the first semiconductor pattern, and at least one gate insulation pattern is formed between the gate and the first semiconductor pattern; the electrode pattern is disposed above the second semiconductor pattern, and at least one capacitance dielectric pattern is formed between the electrode pattern and the second semiconductor pattern, such that the first doping region and the second doping region of the first semiconductor pattern are exposed, and the contact portion of the second semiconductor pattern is exposed; a passivation layer covering the metal oxide semiconductor layer and the first conductive layer and having a first opening through which the first doping region of the first semiconductor pattern is exposed, a second opening through which the second doping region of the first semiconductor pattern is exposed, a third opening through which the contact portion is exposed, and a fourth opening through which the electrode pattern is exposed; a second conductive layer disposed on the passivation layer and comprising a first electrode and a second electrode, wherein the first electrode is electrically connected to the first doping region of the first semiconductor pattern through the first opening; the second electrode is electrically connected to the second doping region of the first semiconductor pattern through the second opening; the gate of the first conductive layer, the first semiconductor pattern, the first electrode and the second electrode form an active element; the second electrode is electrically connected to the contact portion of the second semiconductor pattern through the third opening; and a pixel electrode electrically connected to the second electrode. In certain embodiments, the second semiconductor pattern, the electrode pattern and the second electrode are formed in a partially overlapping mode to form at least two storage capacitors therebetween.

In certain embodiments, the second conductive layer further includes a connection portion which is electrically connected to the electrode pattern of the first conductive layer through the fourth opening of the passivation layer.

In certain embodiments, the at least two storage capacitors include: a first storage capacitor formed by the second semiconductor pattern partially overlapping the electrode pattern of the first conductive layer; and a second storage capacitor formed by the second electrode partially overlapping the electrode pattern of the first conductive layer. In certain embodiments, the second electrode includes a second electrode extending portion partially overlapping the electrode pattern of the first conductive layer, wherein the second storage capacitor is formed by the second electrode extending portion and at least a portion of the electrode pattern.

In certain embodiments, the at least one gate insulation pattern formed between the gate and the first semiconductor pattern includes a first gate insulation pattern disposed on the first semiconductor pattern, and a second gate insulation pattern disposed between the gate and the first gate insulation pattern; and the at least one capacitance dielectric pattern formed between the electrode pattern and the second semiconductor pattern includes a first capacitance dielectric pattern disposed on the second semiconductor pattern and a second capacitance dielectric pattern disposed between the electrode pattern and the first capacitance dielectric pattern. In one embodiment, a conductive pattern is disposed above the second semiconductor pattern and between the first capacitance dielectric pattern and the second capacitance dielectric pattern, where the second semiconductor pattern partially overlaps the conductive pattern to form a third storage capacitor, and the conductive pattern partially overlaps the electrode pattern of the first conductive layer to form a fourth storage capacitor.

On this basis, the storage capacitors of the pixel structure may be achieved by stacking the multiple electrodes or the conductive pattern, and therefore the overall capacitance value of the storage capacitors can be effectively increased while achieving a good aperture ratio.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION OF THE DISCLOSURE

Figure 1:
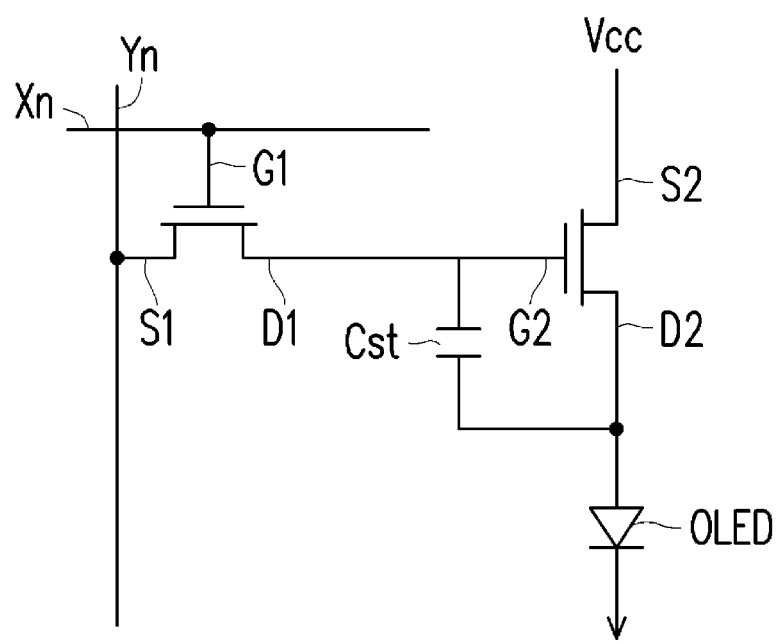
FIG. 1 is an equivalent circuit diagram of a pixel structure of an organic light-emitting diode display panel according to the first embodiment of the invention.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

FIG. 1 is an equivalent circuit diagram of the pixel structure of the organic light-emitting diode display panel according to an embodiment of the invention. Please refer to FIG. 1, the pixel structure of the organic light-emitting diode display panel includes an organic light-emitting diode OLED, a data line Yn, a scanning line Xn, a switch thin film transistor Ta, a driving thin film transistor Tb and a storage capacitor Cst. A gate G1 of the switch thin film transistor Ta is coupled to the scanning line Xn, a first electrode S1 is coupled to the data line Yn, and a second electrode D1 is coupled to a gate G2 of the driving thin film transistor Tb. A second electrode D2 of the driving thin film transistor Tb is coupled to the organic light-emitting diode OLED, and a first electrode S2 is coupled with a power line Vcc. An electrode at one end of the storage capacitor Cst is electrically connected with a second electrode D2 of the driving thin film transistor Tb, and an electrode at the other end of the storage capacitor Cst is electrically connected with the second electrode D1 of the switch thin film transistor Ta.

Figure 2:
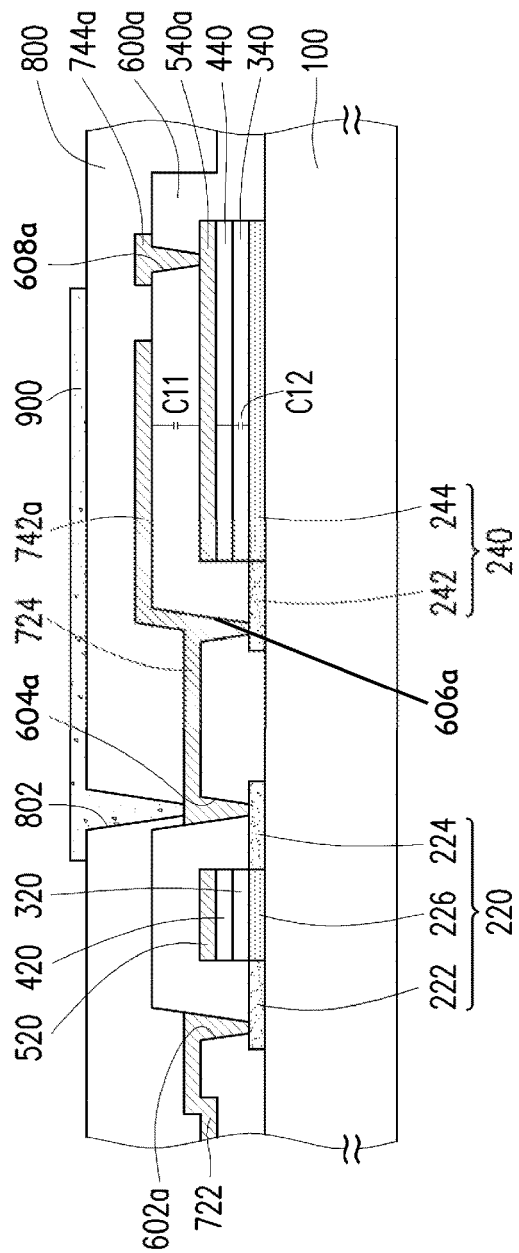
FIG. 2 is a cross-sectional diagram of a pixel structure according to the first embodiment of the invention.

FIG. 2 is a cross-sectional diagram of the pixel structure according to the first embodiment of the invention. Please refer to FIG. 2, in the embodiment, the pixel structure is disposed on a substrate 100 and includes a metal oxide semiconductor layer 200, a first insulating layer 300, a second insulating layer 400, a first conductive layer 500, a passivation layer 600a, a second conductive layer 700, a passivation layer 800, and a pixel electrode 900.

Specifically, the metal oxide semiconductor layer 200 includes a first semiconductor pattern 220 and a second semiconductor pattern 240, wherein the first semiconductor pattern 220 includes a first doping region 222, a second doping region 224 and a channel region 226, and the second semiconductor pattern 240 includes a contact portion 242 and an electrode portion 244. The metal oxide semiconductor layer 200 can be made of Indium-Gallium-Zinc Oxide, (IGZO), ZnO, SnO, Indium-Zinc Oxide (IZO), Gallium-Zinc Oxide (GZO), Zinc-Tin Oxide (ZTO) or Indium-Tin Oxide (ITO) or other suitable metal oxide semiconductor materials. The first doping region 222, the second doping region 224, and the contact portion 242 may be made of doped metal oxide semiconductor materials, for example, the metal oxide semiconductor materials doped with an n-type dopant, but the invention is not limited to these materials. In addition, the portions which are not doped with the materials in the metal oxide semiconductor layer 200 serve as a channel region 226 and the electrode portion 244. The first doping region 222 and the second doping region 224 in the first semiconductor pattern 220 are disposed on the two sides of the channel region 226 respectively. The electrode portion 244 in the second semiconductor pattern 240 is disposed on one side of the contact portion 242.

Please continue to refer to FIG. 2. The first insulating layer 300, the second insulating layer 400 and the first conductive layer 500 are piled on the metal oxide semiconductor layer 200. The first insulating layer 300 and the second insulating layer 400 are made of dielectric materials such as silicon oxide, silicon nitride or silicon oxynitride. The first conductive layer 500 is made of the materials such as metal or other suitable conductive materials. The first insulating layer 300 includes a first gate insulation pattern 320 and a first capacitance dielectric pattern 340, the first gate insulation pattern 320 is disposed on the first semiconductor pattern 220, and the first capacitance dielectric pattern 340 is disposed on the second semiconductor pattern 240. The second insulating layer 400 includes a second gate insulation pattern 420 and a second capacitance dielectric pattern 440, the second gate insulation pattern 420 is disposed on the first gate insulation pattern 320, and the second capacitance dielectric pattern 440 is disposed on the first capacitance dielectric pattern 340. The first conductive layer 500 includes a gate 520 and an electrode pattern 540a, the gate 520 is disposed on the second gate insulation pattern 420, and the electrode pattern 540a is disposed on the second capacitance dielectric pattern 440.

It is worth explaining that the first gate insulation pattern 320 and the second gate insulation pattern 420 in the embodiment are piled together to cover the channel region 226 of the first semiconductor pattern 220, and therefore the first gate insulation pattern 320 and the second gate insulation pattern 420 are used for insulating the gate 520 and the channel region 226 and can further be used for protecting the material characteristics of the channel region 226 and the first gate insulation pattern 320 against influence of the follow-up process, respectively. Similar to the first gate insulation pattern 320 and the second gate insulation pattern 420, the first capacitance dielectric pattern 340 and the second capacitance dielectric pattern 440 in the embodiment are piled together to cover the electrode portion 244 of the second semiconductor pattern 240. The first capacitance dielectric pattern 340 and the second capacitance dielectric pattern 440 are used for insulating the electrode pattern 540a and protecting the material characteristics of the electrode portion 244 and the first capacitance dielectric pattern 340 against influence of the follow-up process, respectively. The first gate insulation pattern 320, the second gate insulation pattern 420 and the gate 520 in the embodiment are formed to expose the first doping region 222 and the second doping region 224; the first capacitance dielectric pattern 340, the second capacitance dielectric pattern 440 and the electrode pattern 540a are formed to expose the contact portion 242.

Next, the passivation layer 600a is disposed on the first conductive layer 500 to cover the metal oxide semiconductor layer 200, the first capacitance dielectric pattern 340, the second capacitance dielectric pattern 440 and the first conductive layer 500, and the passivation layer 600a is provided with a plurality of openings 602a, 604a, 606a and 608a. The second conductive layer 700 is disposed on the passivation layer 600a. Thus, the passivation layer 600a can be used for insulating the second conductive layer 700 from the metal oxide semiconductor layer 200 and the first conductive layer 500. The passivation layer 600a may be an inorganic dielectric layer, which can be made of silicon oxide, silicon nitride, silicon oxynitride or other suitable materials, but is not limited by these materials. The second conductive layer 700 may be made of materials such as metal, or other suitable conductive materials.

The second conductive layer 700 includes a first electrode 722 and a second electrode 724. The first electrode 722 can be electrically connected with the first doping region 222 of the first semiconductor pattern 220 through the corresponding opening 602a, and the second electrode 724 can be electrically connected with the second doping region 224 of the first semiconductor pattern 220 through the corresponding opening 604a. Thus, the gate 520, the first semiconductor pattern 220, the first electrode 722 and the second electrode 724 constitute an active element T1, namely the driving thin film transistor Tb in FIG. 1. Furthermore, the gate 520 of the active element T1 is piled above the channel region 226 of the first semiconductor pattern 220, and therefore the active element T1 is in the form of a top gate type thin film transistor.

In addition, as shown in FIG. 2, the second conductive layer 700 further includes a second electrode extending portion 742a. The second electrode extending portion 742a is disposed to overlap the electrode pattern 540a, the second electrode extending portion 742a is electrically connected with the contact portion 242 of the second semiconductor pattern 240 through the corresponding opening 606a, and thus the second electrode extending portion 742a is electrically connected with the electrode portion 244. As mentioned before, the electrode pattern 540a overlaps the electrode portion 244. Thus, the electrode portion 244, the electrode pattern 540a and the second electrode extending portion 742a constitute a storage capacitor C1, namely the storage capacitor Cst as shown in FIG. 1.

Specifically, the second electrode 724 in the embodiment can extend to a position above the electrode pattern 540a with the second electrode extending portion 742a, where the second electrode 724 is connected with the second electrode extending portion 742a. As mentioned before, the second electrode extending portion 742a is electrically connected with the electrode portion 244, and therefore the second electrode 724, the electrode portion 244 and the second electrode extending portion 742a are all at the same voltage. In addition, the second conductive layer 700 further includes a connection portion 744a. In certain embodiments, the connection portion 744a may be separately disposed from the second electrode extending portion 742a and the second electrode 724, and the connection portion 744a is electrically connected with the electrode pattern 540a through the corresponding opening 608a, and therefore the electrode pattern 540a can provide a voltage different from that of the electrode portion 244 and the second electrode extending portion 742a. Moreover, the electrode pattern 540a is disposed between the electrode portion 244 and the second electrode extending portion 742a, and therefore the storage capacitor C1 is formed by series connection of a first sub-storage-capacitor C11 and a second sub-storage-capacitor C12, wherein the first sub-storage-capacitor C11 is formed by the second electrode extending portion 742a and the electrode pattern 540a, and the second sub-storage-capacitor C12 is formed by the electrode portion 244 and the electrode pattern 540a.

Furthermore, in the embodiment, the passivation layer 800 and a third conductive layer 900 are disposed on the second conductive layer 700, and the third conductive layer 900 serves as the pixel electrode. The passivation layer 800 covers the second conductive layer 700 and the passivation layer 600a, and the third conductive layer 900 is disposed on the passivation layer 800. Thus, the passivation layer 800 is used for insulating the third conductive layer 900 from the second conductive layer 700. The passivation layer 800 may be an organic planar layer, which can be made of the materials such as polyesters (PET), polyolefins, polyacylpropylenes, polycarbonates, polyalkylene oxides, polyphenylenes, polyethers, polyketones, polyalcohols and polyaldehydes or other suitable materials, but is not limited to these materials. The third conductive layer 900 may be made of the material such as metal.

Figure 3:
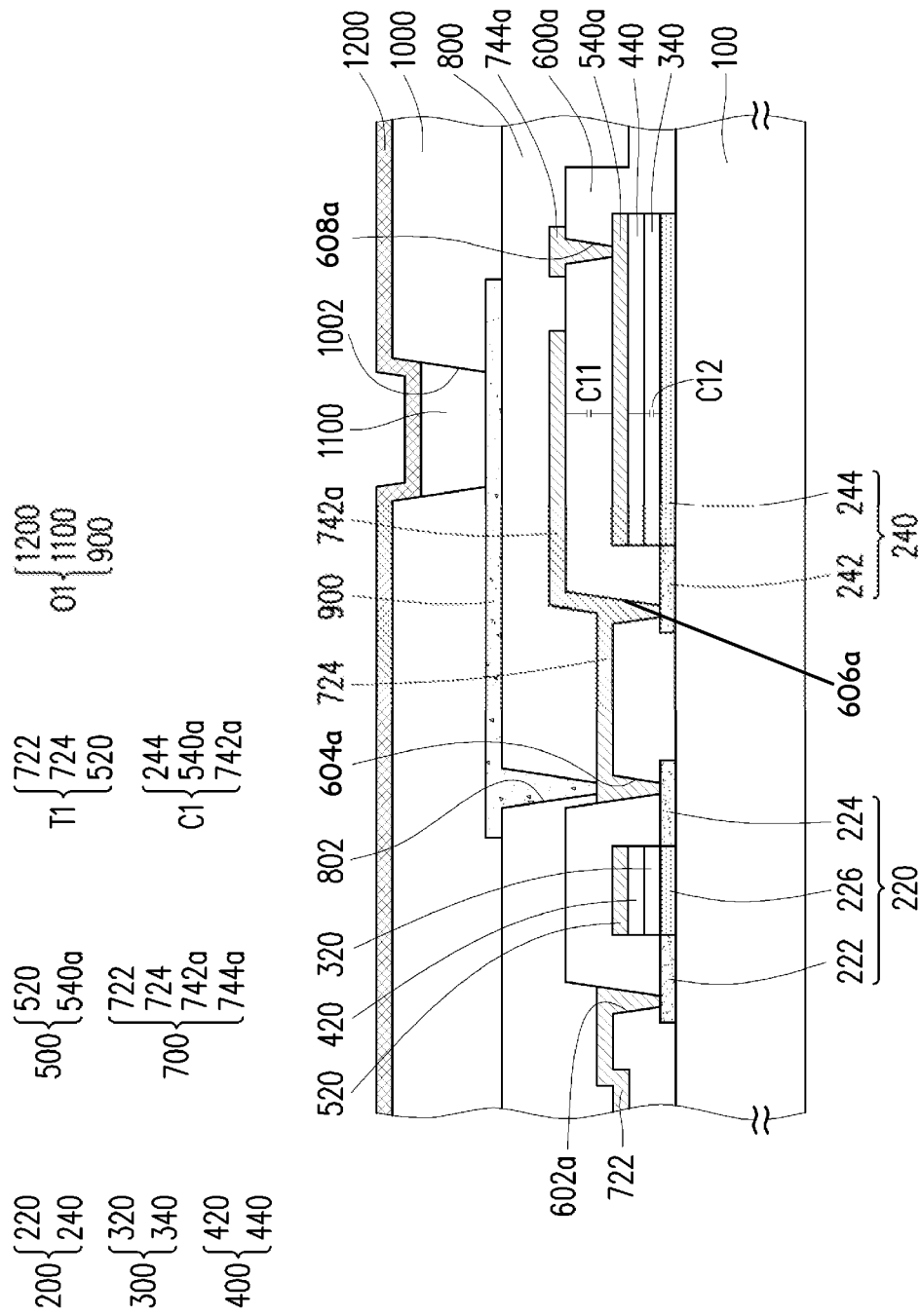
FIG. 3 is a cross-sectional diagram of a pixel structure used in an organic light-emitting diode display panel according to the first embodiment of the invention.

After the pixel structure in FIG. 2 is formed, please refer to FIG. 3 if the pixel structure needs to be applied to the organic light-emitting display panel. Please refer to FIG. 2 and FIG. 3 at the same time, where FIG. 3 shows that a passivation layer 1000, an organic layer 1100 and a fourth conductive layer 1200 are formed on the pixel structure as shown in FIG. 2.

Specifically, the passivation layer 1000 is provided with an opening 1002, and an organic layer 1100 of an organic light-emitting diode is disposed in the opening 1002. A fourth conductive layer 1200 is disposed on the organic layer 1100 and the passivation layer 1000. Thus, the fourth conductive layer 1200 and the third conductive layer 900 serve as two electrodes of the organic light-emitting diode, and the fourth conductive layer 1200, the organic layer 1100 and the third conductive layer 900 constitute an organic light-emitting diode O1, namely the organic light-emitting diode OLED as shown in FIG. 1. Moreover, the fourth conductive layer 1200 can be made of a translucent or light-proof (opaque) conductive material.

It can be understood based on the above embodiment that the storage capacitor C1 in the pixel structure can be achieved by stacking the first sub-storage-capacitor C11 and the second sub-storage-capacitor C12, and therefore the capacitance value of the capacitor C1 can be effectively increased under the condition of achieving a good aperture ratio. In addition, the storage capacitor C1 and the active element T1 of the pixel structure can be achieved on the same film layer, thus achieving the goal of effectively increasing the capacitance value of the storage capacitor C1 without adding any processing steps.

Figure 4:
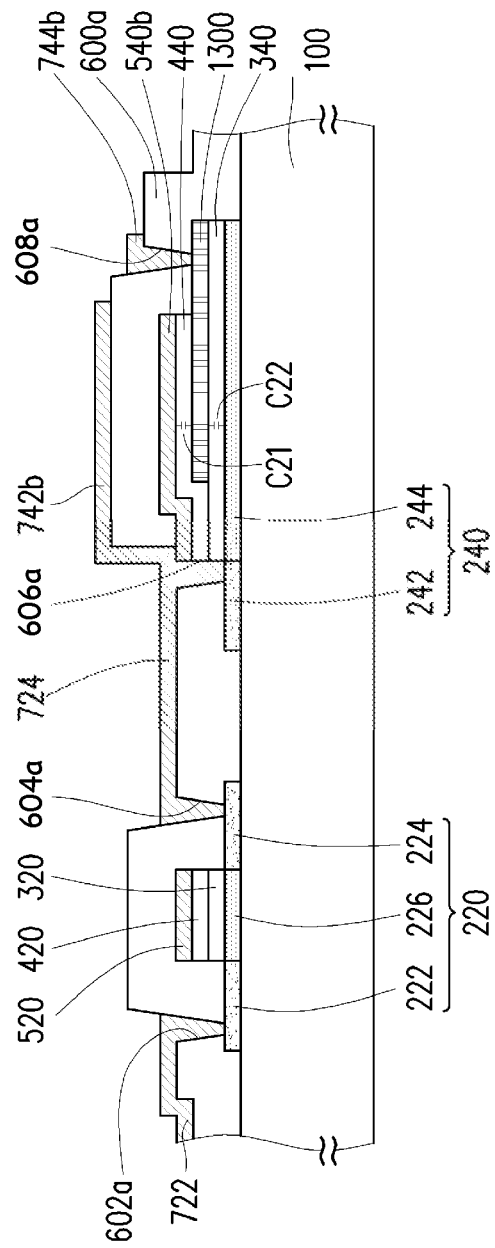
FIG. 4 is a cross-sectional diagram of a pixel structure according to the second embodiment of the invention.

FIG. 4 is a cross-sectional diagram of the pixel structure according to the second embodiment of the invention. Please refer to FIG. 4, the pixel structure in the embodiment is similar to that as shown in FIG. 2, in which the similar components of the pixel structure are expressed by the same reference numbers and have similar functions, and therefore no explanation is repeated. The main difference between the pixel structures as shown in FIG. 4 and in FIG. 2 is that the pixel structure of the embodiment as shown in FIG. 4 further comprises a conductive pattern 1300 disposed above a second semiconductor pattern 240 and is clamped between the first capacitance dielectric pattern 340 and a second capacitance dielectric pattern 440. In addition, the electrode pattern 540b is electrically connected with the second electrode 724 and the second electrode extending portion 742b through the opening 606a. Furthermore, the pixel structure as shown in FIG. 4 does not have the passivation layer 800 and the third conductive layer 900 as shown in FIG. 2.

As shown in FIG. 4, the second electrode extending portion 742b, the electrode pattern 540b and the electrode portion 244 of the second semiconductor pattern 240 are arranged in an overlapping mode, and the second electrode extending portion 742b, the second electrode 724 and the electrode pattern 540b are electrically connected with the contact portion 242 of the second semiconductor pattern 240 through the opening 606a, and therefore the second electrode extending portion 742b, the electrode pattern 540b, and the electrode portion 244 of the second semiconductor pattern 240 are all at the same voltage. Moreover, the second conductive layer 700 further includes the connection portion 744b. In certain embodiments, the second electrode 724 and the second electrode extending portion 742b may be separately disposed from the connection portion 744b and the first electrode 722, and the connection portion 744b is electrically connected with the conductive pattern 1300 through an opening 608a, such that the conductive pattern 1300 has a voltage different from that of the electrode portion 244, the second electrode extending portion 742b and the electrode pattern 540b. Thus, the electrode portion 244 of the second semiconductor pattern, the conductive pattern 1300, the electrode pattern 540b and the second electrode extending portion 742b constitute a storage capacitor C2, namely the storage capacitor Cst as shown in FIG. 1.

In the embodiment, the conductive pattern 1300 is disposed between the electrode portion 244 and the electrode pattern 540b and between the electrode portion 244 and the second electrode extending portion 742b, and therefore the storage capacitor C2 is formed by a series connection of a first sub-storage-capacitor C21 and a second sub-storage-capacitor C22, wherein the first sub-storage-capacitor C21 is formed by the electrode pattern 540b and the conductive pattern 1300, and the second sub-storage-capacitor C22 is formed by the conductive pattern 1300 and the electrode portion 244, and the storage capacitor of the pixel structure in the embodiment has a higher capacitance value compared with the pixel structure as shown in FIG. 2. In addition, in the embodiment, the second electrode extending portion 742b is connected with the second electrode 724, and the second electrode extending portion 742b serves as the pixel electrode.

Figure 5:
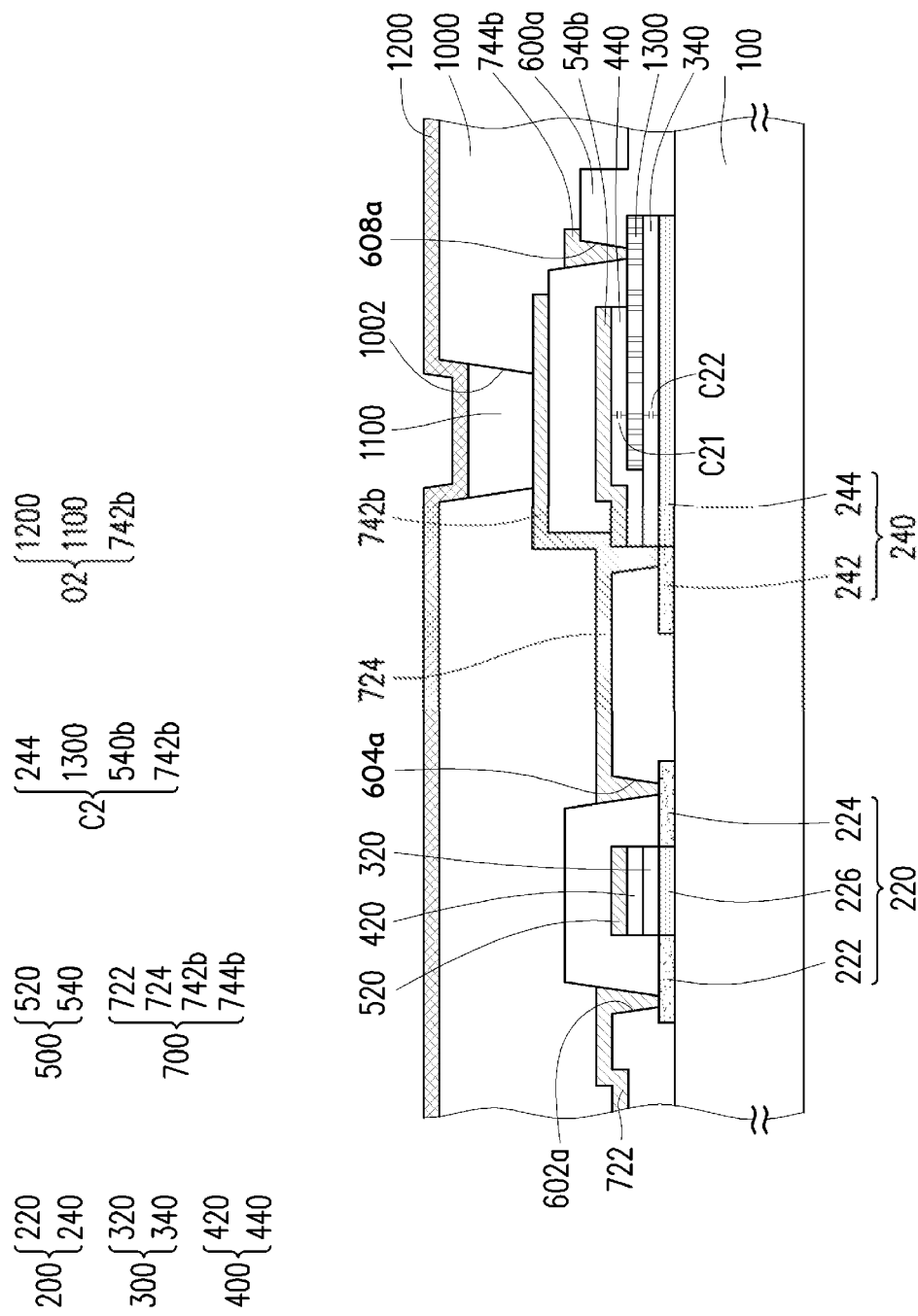
FIG. 5 is a cross-sectional diagram of a pixel structure used in an organic light-emitting diode display panel according to the second embodiment of the invention.

After the pixel structure in FIG. 4 is formed, please refer to FIG. 5 if the pixel structure needs to be applied to an organic light-emitting display panel. Please refer to FIG. 4 and FIG. 5 at the same time, where FIG. 5 shows that a passivation layer 1000, an organic layer 1100 and a fourth conductive layer 1200 are formed on the pixel structure as shown in FIG. 4. The organic layer 1100 of an organic light-emitting diode is disposed in an opening 1002 of the passivation layer 1000. A fourth conductive layer 1200 is disposed on the organic layer 1100 and the passivation layer 1000. The fourth conductive layer 1200, the organic layer 1100 and the second electrode extending portion 742b constitute an organic light-emitting diode O2, namely the organic light-emitting diode OLED as shown in FIG. 1. Moreover, the fourth conductive layer 1200 can be made of a translucent or light-proof (opaque) conductive material.

It can be understood based on the above embodiment that the storage capacitor C2 in the pixel structure can be achieved by stacking the first sub-storage-capacitor C21 and the second sub-storage-capacitor C22, and therefore the capacitance value of the capacitor C2 can be effectively increased under the condition of achieving a good aperture ratio.

Figure 6:
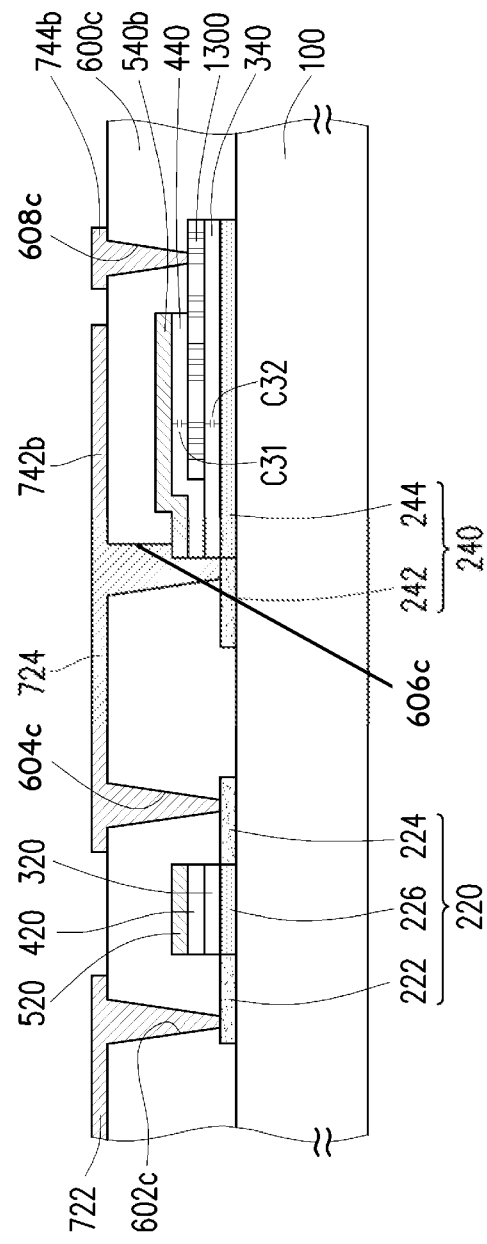
FIG. 6 is a cross-sectional diagram of a pixel structure according to the third embodiment of the invention.

FIG. 6 is a cross-sectional diagram of the pixel structure according to the third embodiment of the invention. Please refer to FIG. 6, the pixel structure in the embodiment is similar to that as shown in FIG. 4, in which the similar components of the pixel structure are expressed by the same reference numbers and have similar functions, and therefore no explanation is repeated. The main difference between the pixel structures as shown in FIG. 6 and in FIG. 4 is that a passivation layer 600c in the embodiment as shown in FIG. 6 is an organic planar layer.

Specifically, the passivation layer 600c may be made of materials such as polyesters (PET), polyolefins, polyacylpropylenes, polycarbonates, polyalkylene oxides, polyphenylenes, polyethers, polyketones, polyalcohols and polyaldehydes or other suitable materials, but is not limited to these materials. The first electrode 722 can be electrically connected with the first doping region 222 of the first semiconductor pattern 220 through an opening 602c of the passivation layer 600c, and the second electrode 724 can be electrically connected with the second doping region 224 of the first semiconductor pattern 220 through an opening 604c of the passivation layer 600c. The second electrode 724, the second electrode extending portion 742b and the electrode pattern 540b are electrically connected with the contact portion 242 of the second semiconductor pattern 240 through the opening 606c. The second electrode 724, the second electrode extending portion 742b, the electrode pattern 540b and an electrode portion 244 of the second semiconductor pattern 240 are all at the same voltage. Moreover, the connection portion 744b of the second conductive layer 700 is electrically connected with the conductive pattern 1300 through the opening 608c, and therefore the conductive pattern 1300 can provide a voltage different from that of the electrode portion 244, the second electrode extending portion 742b and the electrode pattern 540b. Thus, the electrode portion 244 of the second semiconductor pattern 240, the conductive pattern 1300, the electrode pattern 540b and the second electrode extending portion 742b constitute a storage capacitor C3, namely the storage capacitor Cst as shown in FIG. 1. The storage capacitor C3 is formed by a series connection of a first sub-storage-capacitor C31 and a second sub-storage-capacitor C32, wherein the first sub-storage-capacitor C31 is formed by the electrode pattern 540b and the conductive pattern 1300, and the second sub-storage-capacitor C32 is formed by the conductive pattern 1300 and the electrode portion 244.

Figure 7:
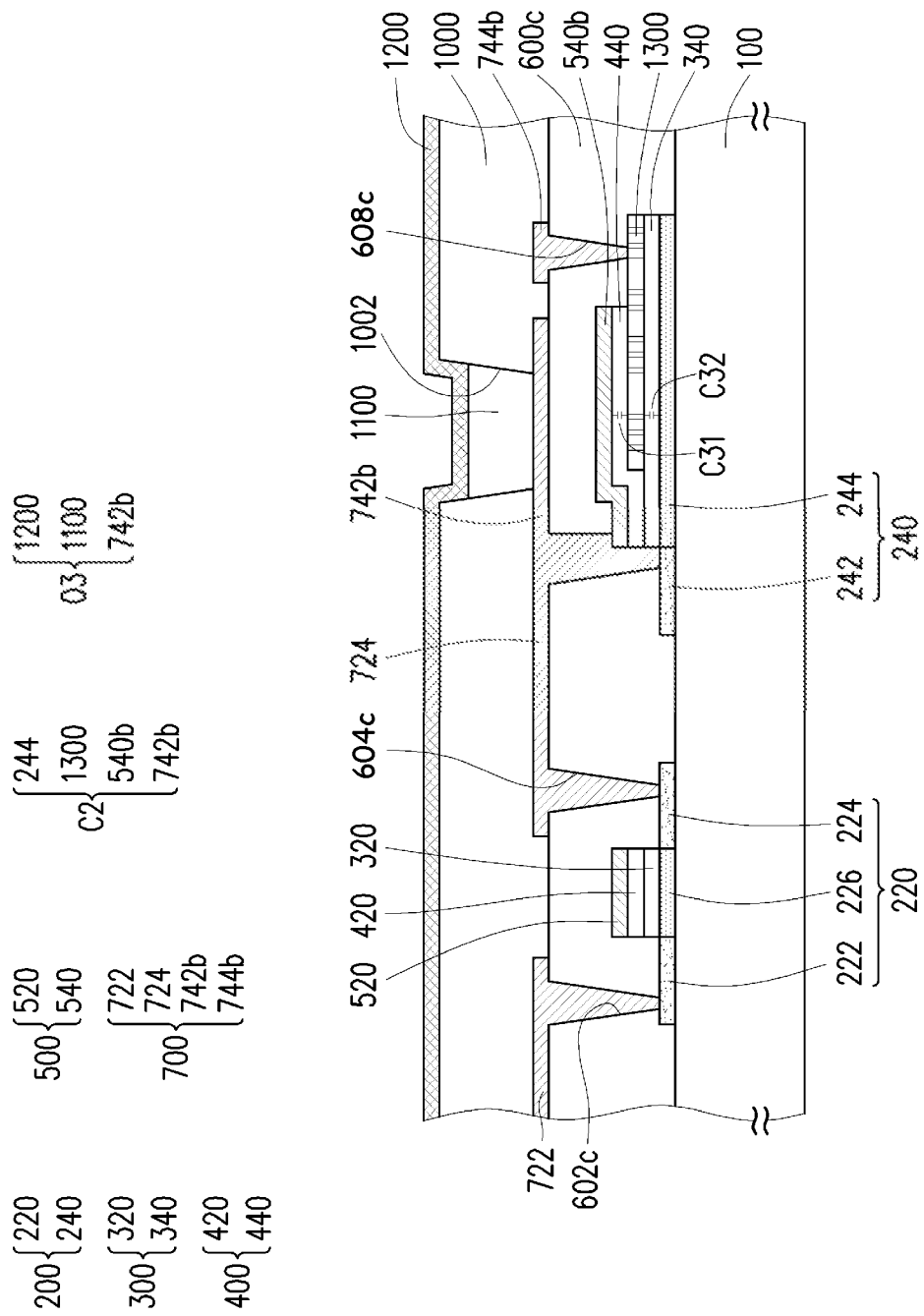
FIG. 7 is a cross-sectional diagram of a pixel structure used in an organic light-emitting diode display panel according to the third embodiment of the invention.

After the pixel structure in FIG. 6 is formed, please refer to FIG. 7 if the pixel structure needs to be applied to the organic light-emitting display panel. Please refer to FIG. 6 and FIG. 7 at the same time, where FIG. 7 shows that a passivation layer 1000, an organic layer 1100 and a fourth conductive layer 1200 are formed on the pixel structure as shown in FIG. 6. The fourth conductive layer 1200, the organic layer 1100 and the second electrode extending portion 742b constitute an organic light-emitting diode O3, namely the organic light-emitting diode OLED as shown in FIG. 1. Moreover, the fourth conductive layer 1200 can be made of a translucent or light-proof (opaque) conductive material. When the fourth conductive layer 1200 is made of a translucent material, the passivation layer 1000, the organic layer 1100 and the fourth conductive layer 1200 of the pixel structure as shown in FIG. 6 constitute an upward light-emitting type organic light-emitting diode substrate. When the fourth conductive layer 1200 is made of a light-proof material, the passivation layer 1000, the organic layer 1100 and the fourth conductive layer 1200 of the pixel structure as shown in FIG. 6 constitute a downward light-emitting type organic light-emitting diode substrate.

Figure 8:
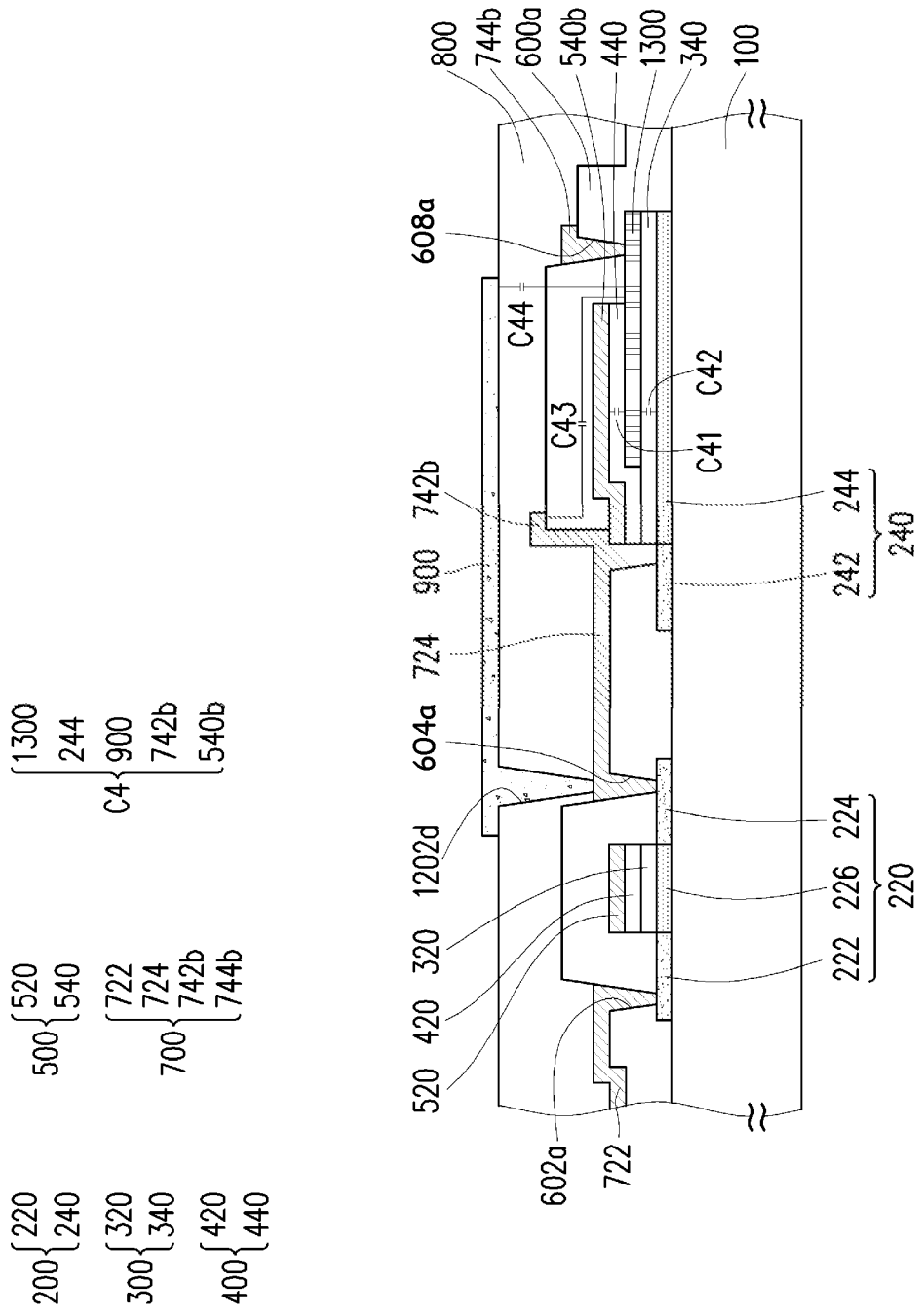
FIG. 8 is a cross-sectional diagram of a pixel structure according to the fourth embodiment of the invention.

FIG. 8 is a cross-sectional diagram of the pixel structure according to the fourth embodiment of the invention. Please refer to FIG. 8, the pixel structure in the embodiment is similar to that as shown in FIG. 6, in which the similar components of the pixel structure are expressed by the same reference numbers and have similar functions, and therefore no explanation is repeated. The main difference between the pixel structures as shown in FIG. 8 and in FIG. 6 is that a passivation layer 800 and a third conductive layer 900 are formed on the second conductive layer 700 of the pixel structure in the embodiment as shown in FIG. 8, and the third conductive layer 900 serves as the pixel electrode.

Specifically, the passivation layer 800 covers the second conductive layer 700 and a passivation layer 600a, and the third conductive layer 900 is disposed on the passivation layer 800. Thus, the passivation layer 800 is used for insulating the third conductive layer 900 from the second conductive layer 700. The passivation layer 800 may be an organic planar layer, which is made of materials such as polyesters (PET), polyolefins, polyacylpropylenes, polycarbonates, polyalkylene oxides, polyphenylenes, polyethers, polyketones, polyalcohols and polyaldehydes or other suitable materials, but not limited to these materials. The third conductive layer 900 may be made of material like metal or other suitable conductive materials.

As shown in FIG. 8, the passivation layer 800 is provided with an opening 1202d. The third conductive layer 900, the second electrode extending portion 742b, the electrode pattern 540b and the electrode portion 244 of the second semiconductor pattern 240 are disposed in an overlapping mode, and the third conductive layer 900 is connected with the second electrode 724 of the second conductive layer 700 through the opening 1202d. The third conductive layer 900, the second electrode extending portion 742b, the electrode pattern 540b, the second doping region 224 of the first semiconductor pattern 220 and the electrode portion 244 of the second semiconductor pattern 240 are all at the same voltage. Moreover, the conductive pattern 1300 can provide a voltage different from that of the electrode portion 244, the second electrode extending portion 742b and the electrode pattern 540b. Thus, the third conductive layer 900, the electrode portion 244 of the second semiconductor pattern 240, the conductive pattern 1300, the electrode pattern 540b and the second electrode extending portion 742b constitute a storage capacitor C4, namely the storage capacitor Cst as shown in FIG. 1. The storage capacitor C4 is formed by a series connection of a first sub-storage-capacitor C41, a second sub-storage-capacitor C42, a third second sub-storage-capacitor C43 and a fourth sub-storage-capacitor C44, wherein the first sub-storage-capacitor C41 is formed by the electrode pattern 540b and the conductive pattern 1300, the second sub-storage-capacitor C42 is formed by the conductive pattern 1300 and the electrode portion 244, the third second sub-storage-capacitor C43 is formed by the second electrode extending portion 742b and the conductive pattern 1300, and the fourth sub-storage-capacitor C44 is formed by the third conductive layer 900 and the conductive pattern 1300.

Figure 9:
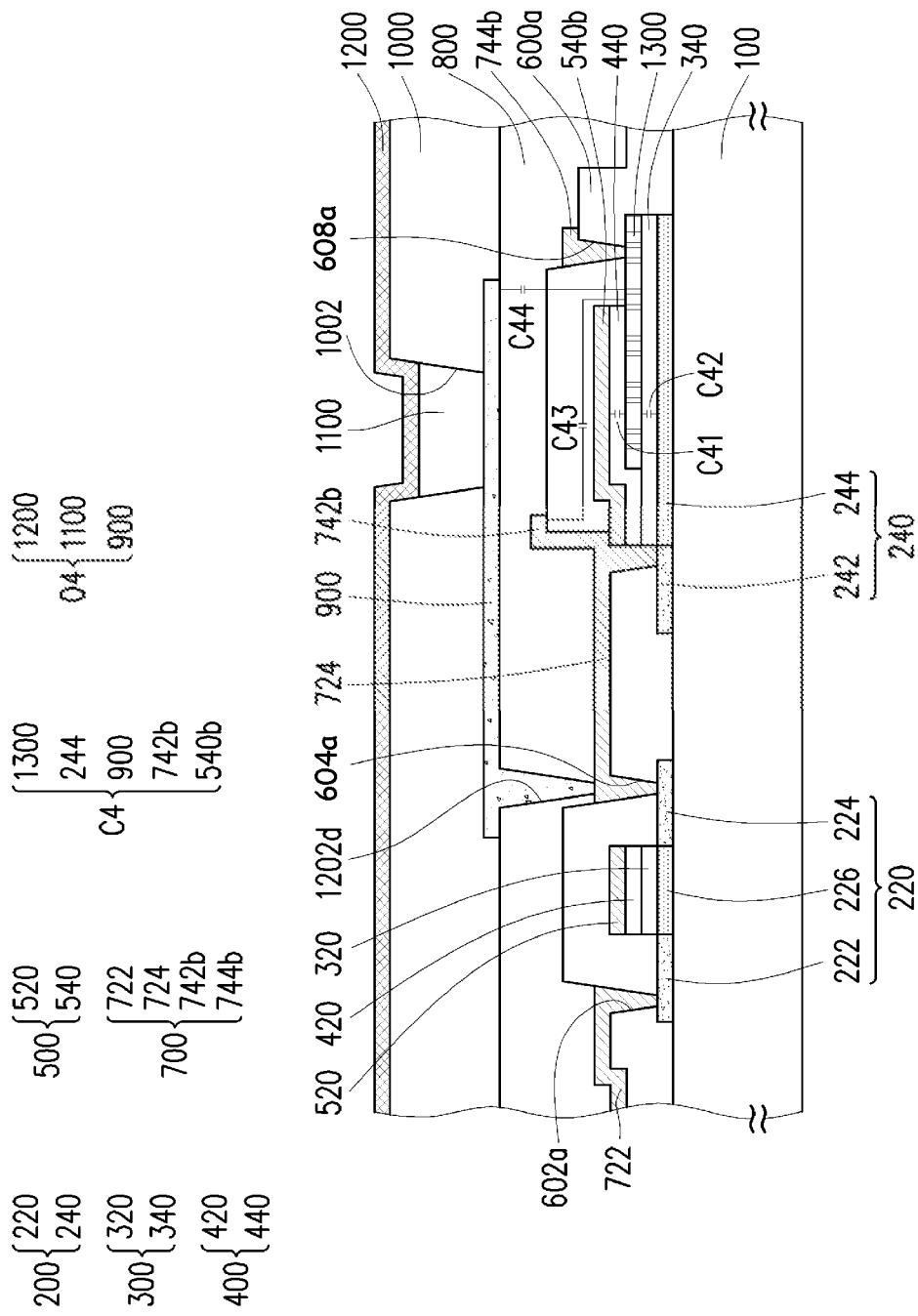
FIG. 9 is a cross-sectional diagram of a pixel structure used in an organic light-emitting diode display panel according to the fourth embodiment of the invention.

After the pixel structure in FIG. 8 is formed, please refer to FIG. 9 if the pixel structure is required to be applied to the organic light-emitting display panel. Please refer to FIG. 8 and FIG. 9 at the same time, where FIG. 9 shows that a passivation layer 1000, an organic layer 1100 and a fourth conductive layer 1200 are formed on the pixel structure as shown in FIG. 8. The organic layer 1100 of an organic light-emitting diode is disposed in an opening 1002 of the passivation layer 1000. The fourth conductive layer 1200 is disposed on the organic layer 1100 and the passivation layer 1000. Thus, the fourth conductive layer 1200, the organic layer 1100 and the third conductive layer 900 constitute an organic light-emitting diode O4, namely the organic light-emitting diode OLED as shown in FIG. 1. Moreover, the fourth conductive layer 1200 can be made of a translucent or light-proof (opaque) conductive material.

It can be understood based on the above embodiment that the storage capacitor C4 in the pixel structure can be achieved by stacking the first sub-storage-capacitor C41, the second sub-storage-capacitor C42, the third sub-storage-capacitor C43 and the fourth sub-storage-capacitor C44, and therefore the capacitance value of the capacitor C4 can be effectively increased under the condition of achieving a good aperture ratio.

Figure 10:
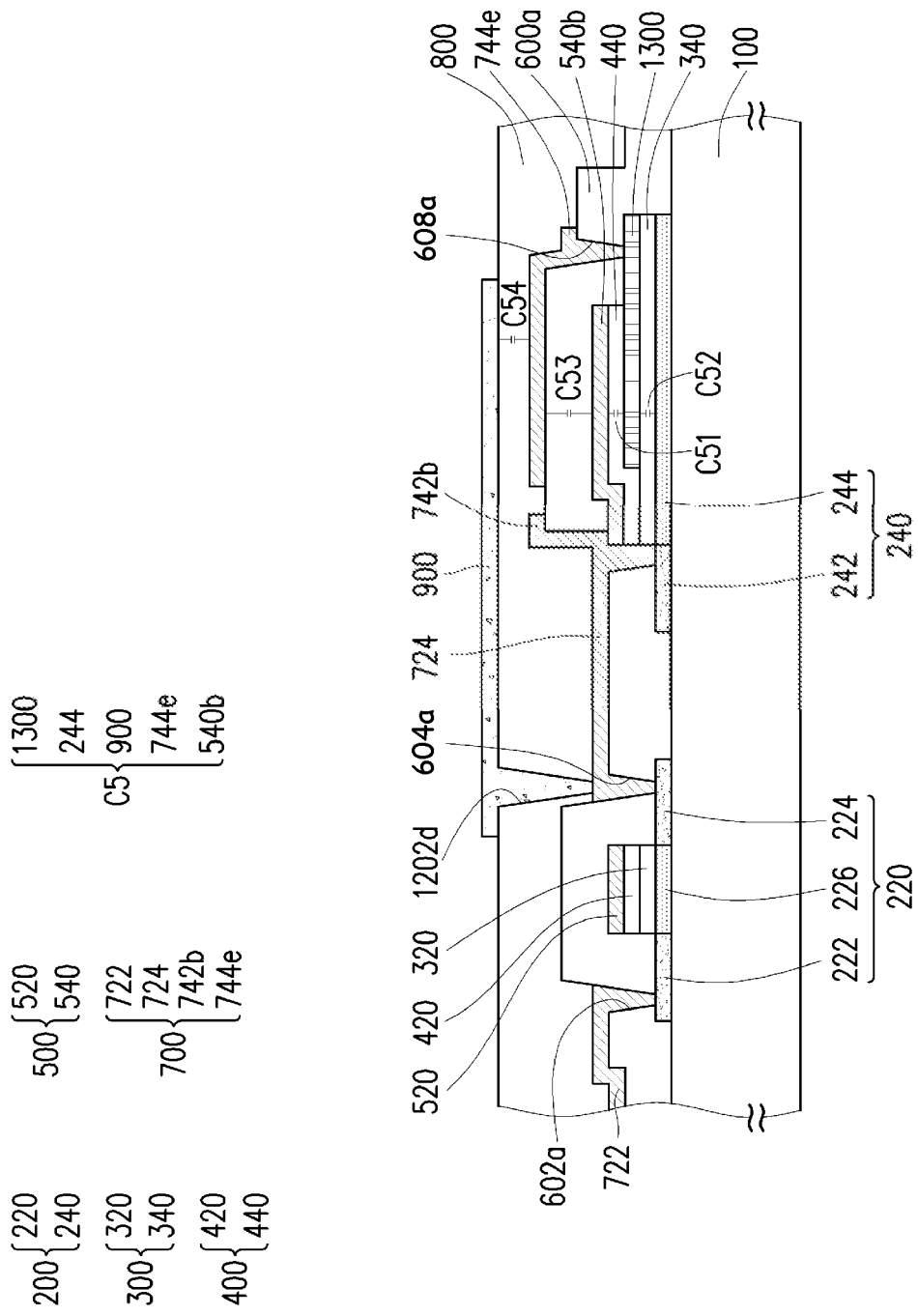
FIG. 10 is a cross-sectional diagram of a pixel structure according to the fifth embodiment of the invention.

FIG. 10 is a cross-sectional diagram of the pixel structure according to the fifth embodiment of the invention. Please refer to FIG. 10, the pixel structure in the embodiment is similar to that as shown in FIG. 8, in which the similar components of the pixel structure are expressed by the same reference numbers and have similar functions, and therefore no explanation is repeated. The main difference between the pixel structures as shown in FIG. 8 and in FIG. 10 is that, as shown in FIG. 10, a connection portion 744e in the embodiment is disposed to partially overlap the electrode pattern 540b, and a third conductive layer 900 is disposed to overlap the connection portion 744e.

Specifically, the third conductive layer 900, the second electrode extending portion 742b, the electrode pattern 540b, and the electrode portion 244 of the second semiconductor pattern 240 are disposed in an overlapping mode, and the third conductive layer 900, the second electrode extending portion 742b, the electrode pattern 540b, the second doping region 224 of the first semiconductor pattern 220, and the electrode portion 244 of the second semiconductor pattern 240 are all at the same voltage. Moreover, the connection portion 744e and the conductive pattern 1300 are both at the same voltage which is different from the voltage of the electrode portion 244, the second electrode extending portion 742b and the electrode pattern 540b. Thus, the third conductive layer 900, the connection portion 744e, the electrode pattern 540b, the conductive pattern 1300 and the electrode portion 244 of the second semiconductor pattern 240 constitute a storage capacitor C5, namely the storage capacitor Cst as shown in FIG. 1. The storage capacitor C5 is formed by a series connection of a first sub-storage-capacitor C51, a second sub-storage-capacitor C52, a third second sub-storage-capacitor C53 and a fourth sub-storage-capacitor C54, wherein the first sub-storage-capacitor C51 is formed by the electrode pattern 540b and the conductive pattern 1300, the second sub-storage-capacitor C52 is formed by the conductive pattern 1300 and the electrode portion 244, the third second sub-storage-capacitor C53 is formed by the electrode pattern 540b and the connection portion 744e, and the fourth sub-storage-capacitor C54 is formed by the third conductive layer 900 and the connection portion 744e. It is worth mentioning that the stacking mode of the storage capacitor is that the third conductive layer 900, the electrode pattern 540b and the electrode portion 244 of the second semiconductor pattern 240 are disposed to be staggered with the connection portion 744e and the conductive pattern 1300, wherein the electrode pattern 540b and the electrode portion 244 of the second semiconductor pattern 240 are at the same voltage, and the connection portion 744e and the conductive pattern 1300 are at another same voltage.

Figure 11:
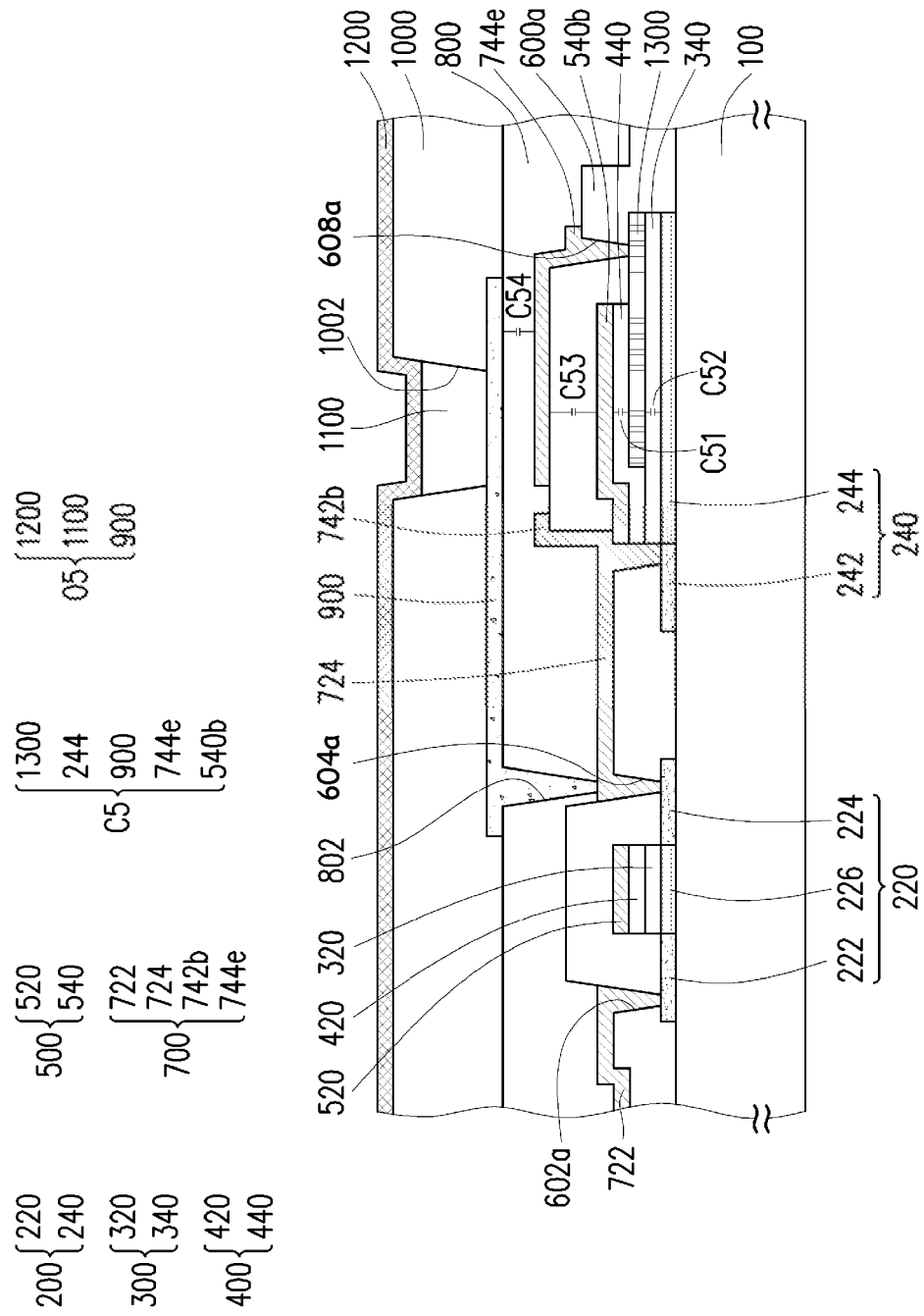
FIG. 11 is a cross-sectional diagram of a pixel structure used in an organic light-emitting diode display panel according to the fifth embodiment of the invention.

After the pixel structure in FIG. 10 is formed, please refer to FIG. 11 if the pixel structure is required to be applied to the organic light-emitting display panel. Please refer to FIG. 10 and FIG. 11 at the same time, where FIG. 11 shows that a passivation layer 1000, an organic layer 1100 and a fourth conductive layer 1200 are formed on the pixel structure as shown in FIG. 10. The organic layer 1100 of an organic light-emitting diode is disposed in an opening 1002 of the passivation layer 1000. The fourth conductive layer 1200 is disposed on the organic layer 1100 and the passivation layer 1000. Thus, the fourth conductive layer 1200, the organic layer 1100 and the third conductive layer 900 constitute an organic light-emitting diode O5, namely the organic light-emitting diode OLED as shown in FIG. 1. Moreover, the fourth conductive layer 1200 can be made of a translucent or light-proof (opaque) conductive material.

It can be understood based on the above embodiment that the storage capacitor C5 in the pixel structure can be achieved by stacking the first sub-storage-capacitor C51, the second sub-storage-capacitor C52, the third sub-storage-capacitor C53 and the fourth sub-storage-capacitor C54, and therefore the capacitance value of the capacitor C5 can be effectively increased under the condition of achieving a good aperture ratio.

Figure 12:
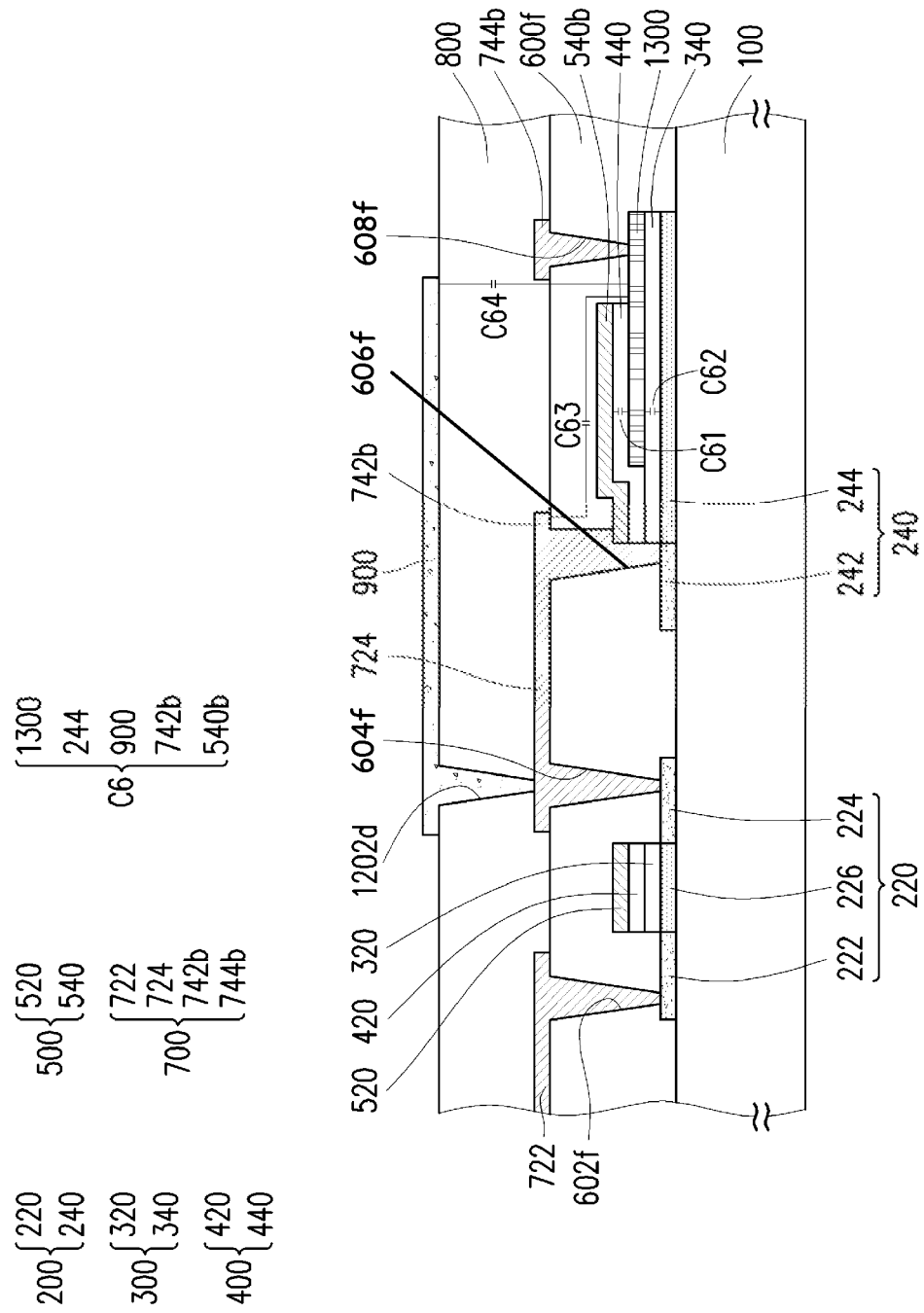
FIG. 12 is a cross-sectional diagram of a pixel structure according to the sixth embodiment of the invention.

FIG. 12 is a cross-sectional diagram of the pixel structure according to the sixth embodiment of the invention. Please refer to FIG. 12, the pixel structure in the embodiment is similar to that as shown in FIG. 8, in which the similar components of the pixel structure are expressed by the same reference numbers and have similar functions, and therefore no explanation is repeated. The main difference between the pixel structures as shown in FIG. 8 and in FIG. 12 is that a passivation layer 600f of the embodiment as shown in FIG. 12 is an organic planar layer.

Specifically, the passivation layer 600f may be made of materials such as polyesters (PET), polyolefins, polyacylpropylenes, polycarbonates, polyalkylene oxides, polyphenylenes, polyethers, polyketones, polyalcohols and polyaldehydes or other suitable materials, but is not limited to these materials. The first electrode 722 can be electrically connected with the first doping region 222 of the first semiconductor pattern 220 through an opening 602f of the passivation layer 600f, and the second electrode 724 can be electrically connected with the second doping region 224 of the first semiconductor pattern 220 through an opening 604f of the passivation layer 600f. The third conductive layer 900, the electrode portion 244 of the second semiconductor pattern 240, the conductive pattern 1300, the electrode pattern 540b and the second electrode extending portion 742b constitute a storage capacitor C6, namely the storage capacitor Cst as shown in FIG. 1. The storage capacitor C6 is formed by a series connection of a first sub-storage-capacitor C61, a second sub-storage-capacitor C62, a third second sub-storage-capacitor C63 and a fourth sub-storage-capacitor C64, wherein the first sub-storage-capacitor C61 is formed by the electrode pattern 540b and the conductive pattern 1300, the second sub-storage-capacitor C62 is formed by the conductive pattern 1300 and the electrode portion 244, the third second sub-storage-capacitor C63 is formed by the second electrode extending portion 742b and the conductive pattern 1300, and the fourth sub-storage-capacitor C64 is formed by third conductive layer 900 and the conductive pattern 1300.

Figure 13:
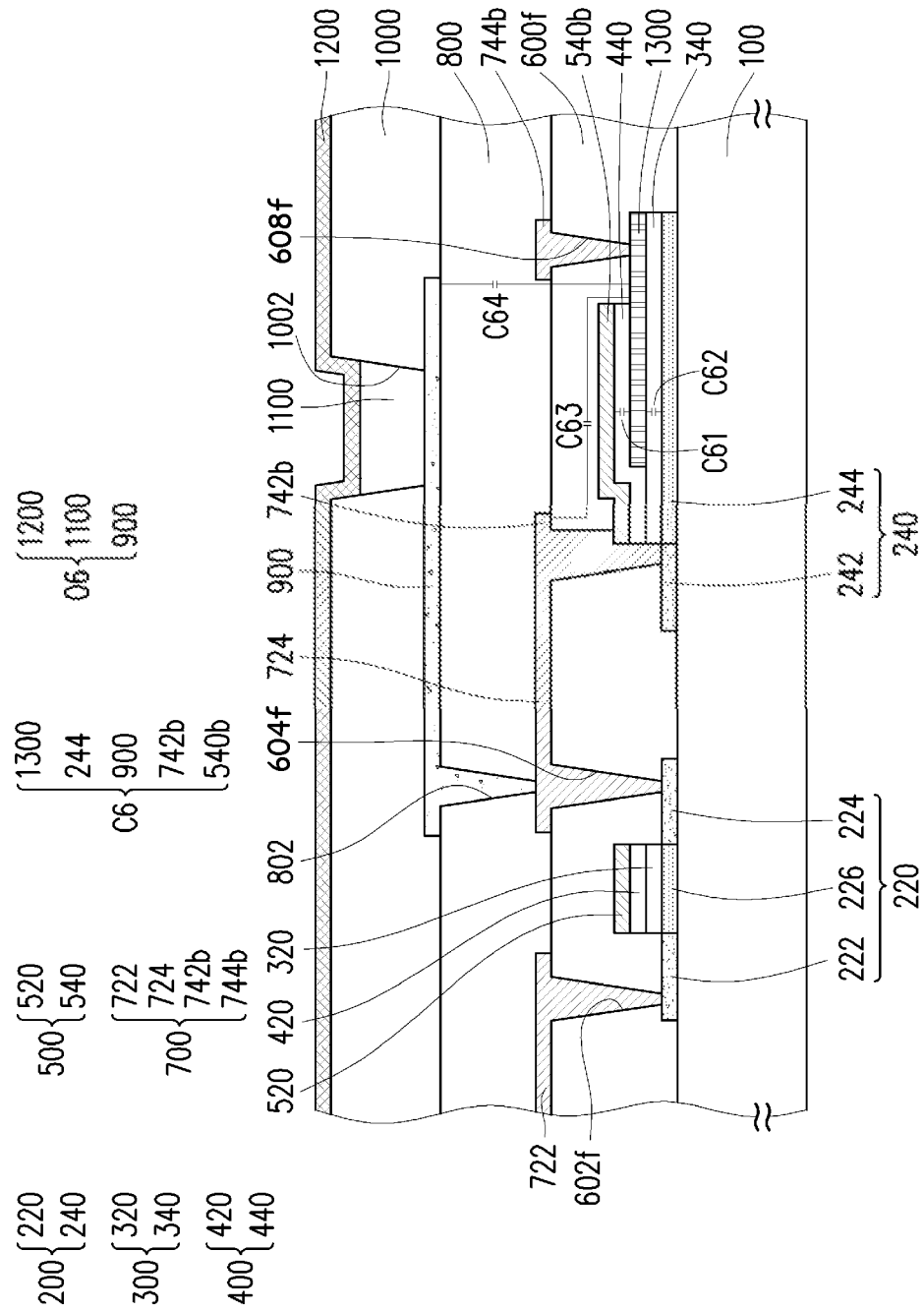
FIG. 13 is a cross-sectional diagram of a pixel structure used in an organic light-emitting diode display panel according to the sixth embodiment of the invention.

After the pixel structure in FIG. 12 is formed, please refer to FIG. 13 if the pixel structure needs to be applied to the organic light-emitting display panel. Please refer to FIG. 12 and FIG. 13 at the same time, where FIG. 13 shows that a passivation layer 1000, an organic layer 1100 and a fourth conductive layer 1200 are formed on the pixel structure as shown in FIG. 12. The fourth conductive layer 1200, the organic layer 1100 and the third conductive layer 900 constitute an organic light-emitting diode O6, namely the organic light-emitting diode OLED as shown in FIG. 1. Moreover, the fourth conductive layer 1200 can be made of a translucent or light-proof (opaque) conductive material.

It can be understood based on the above embodiment that the storage capacitor C6 in the pixel structure can be achieved by stacking a first sub-storage-capacitor C61, a second sub-storage-capacitor C62, a third sub-storage-capacitor C63 and a fourth sub-storage-capacitor C64, and therefore the capacitance value of the capacitor C6 can be effectively increased under the condition of achieving a good aperture ratio.

Figure 14:
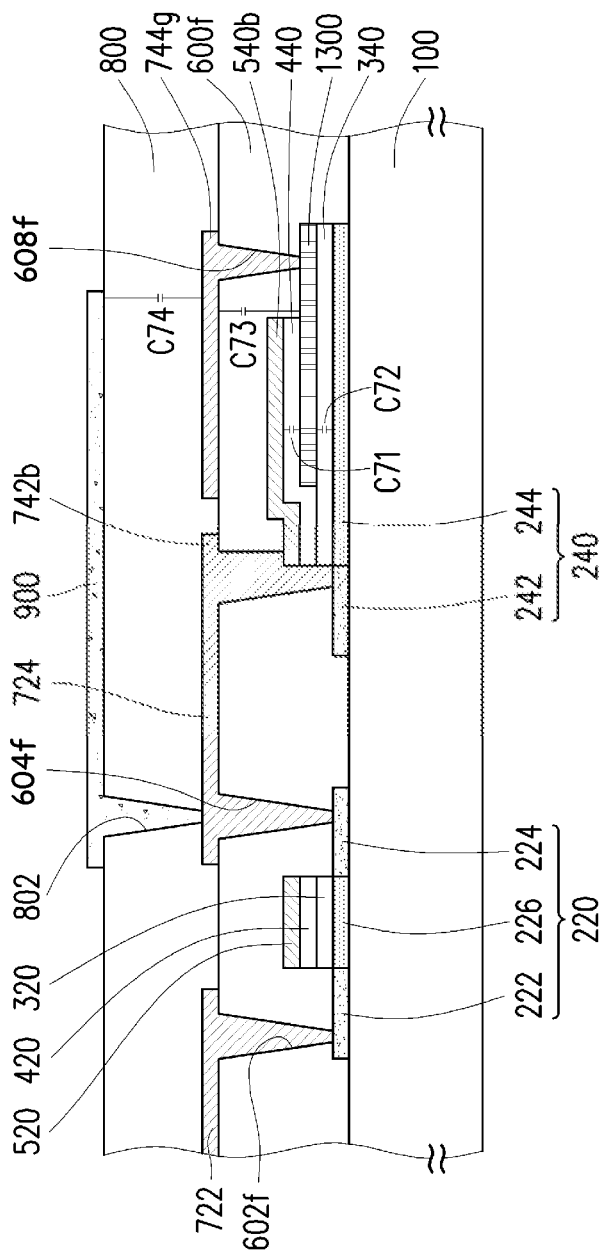
FIG. 14 is a cross-sectional diagram of a pixel structure according to the seventh embodiment of the invention.

FIG. 14 is a cross-sectional diagram of the pixel structure according to the seventh embodiment of the invention. Please refer to FIG. 14, the pixel structure in the embodiment is similar to that as shown in FIG. 12, in which the similar components of the pixel structure are expressed by the same reference numbers and have similar functions, and therefore no explanation is repeated. The main difference between the pixel structures as shown in FIG. 14 and in FIG. 12 is that a connection portion 744g of the embodiment as shown in FIG. 14 is disposed to overlap an electrode pattern 540b, and a third conductive layer 900 is disposed to overlap the connection portion 744g.

Specifically, the third conductive layer 900, the second electrode extending portion 742b, the electrode pattern 540b, the electrode portion 244 of the second semiconductor pattern 240 are disposed in an overlapping mode, and the third conductive layer 900, the second electrode extending portion 742b, the electrode pattern 540b, and the electrode portion 244 of the second semiconductor pattern 240 are all at the same voltage. Moreover, the connection portion 744g and the conductive pattern 1300 are at the same voltage which is different from the voltage of the electrode portion 244, the second electrode extending portion 742b and the electrode pattern 540b. Thus, the third conductive layer 900, the connection portion 744g, the electrode pattern 540b, the conductive pattern 1300 and the electrode portion 244 of the second semiconductor pattern 240 constitute a storage capacitor C7, namely the storage capacitor Cst as shown in FIG. 1. The storage capacitor C7 is formed by a series connection of a first sub-storage-capacitor C71, a second sub-storage-capacitor C72, a third second sub-storage-capacitor C73 and a fourth sub-storage-capacitor C74, wherein the first sub-storage-capacitor C71 is formed by the electrode pattern 540b and the conductive pattern 1300, the second sub-storage-capacitor C72 is formed by the conductive pattern 1300 and the electrode portion 244, the third second sub-storage-capacitor C73 is formed by the electrode pattern 540b and the connection portion 744g, and the fourth sub-storage-capacitor C74 is formed by the third conductive layer 900 and the connection portion 744g. It is worth mentioning that the stacking mode of the storage capacitor C7 is that the third conductive layer 900, the electrode pattern 540b and the electrode portion 244 of the second semiconductor pattern 240 are disposed to be staggered with the connection portion 744g and the conductive pattern 1300, wherein the third conductive layer 900, the electrode pattern 540b and the electrode portion 244 of the second semiconductor pattern 240 are at the same voltage, and the connection portion 744g and the conductive pattern 1300 are at another same voltage.

Figure 15:
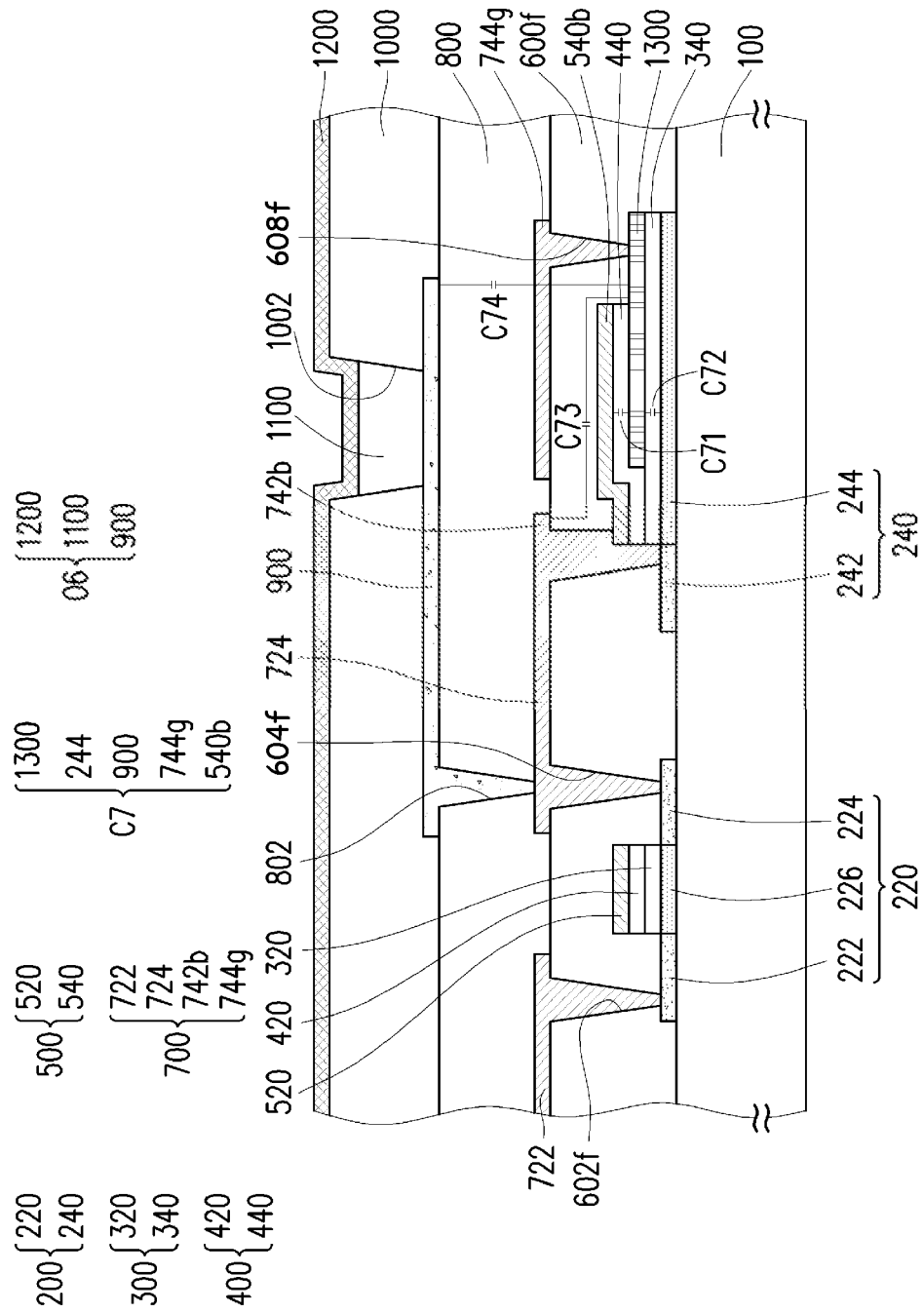
FIG. 15 is a cross-sectional diagram of a pixel structure used in an organic light-emitting diode display panel according to the seventh embodiment of the invention.

After the pixel structure in FIG. 14 is formed, please refer to FIG. 15 if the pixel structure is required to be applied to the organic light-emitting display panel. Please refer to FIG. 14 and FIG. 15 at the same time, where FIG. 15 shows that a passivation layer 1000, an organic layer 1100 and a fourth conductive layer 1200 are formed on the pixel structure as shown in FIG. 14. The organic layer 1100 of the organic light-emitting diode is disposed in an opening 1002 of the passivation layer 1000. The fourth conductive layer 1200 is disposed on the organic layer 1100 and the passivation layer 1000. Thus, the fourth conductive layer 1200, the organic layer 1100 and the third conductive layer 900 constitute an organic light-emitting diode O7, namely the organic light-emitting diode OLED as shown in FIG. 1. Moreover, the fourth conductive layer 1200 can be made of a translucent or light-proof (opaque) conductive material.

It can be understood based on the above embodiment that the storage capacitor C7 in the pixel structure can be achieved by stacking the first sub-storage-capacitor C71, the second sub-storage-capacitor C72, the second sub-storage-capacitor C73 and the second sub-storage-capacitor C74, and therefore the capacitance value of the capacitor C7 can be effectively increased under the condition of achieving a good aperture ratio.

In summary, the storage capacitor of the pixel structure is achieved by stacking the multiple electrodes or the conductive pattern, and therefore the capacitance value of the storage capacitor can be effectively increased under the condition of achieving the good aperture ratio. In addition, the storage capacitor and the active element of the pixel structure can be achieved on the same film layer, and therefore the aim of effectively increasing the capacitance value of the storage capacitor can be achieved under the condition without adding processing steps. Furthermore, when one conductive pattern is additionally disposed between the first capacitance dielectric pattern and the second capacitance dielectric pattern, the passivation layer and a fourth conductive layer are additionally disposed on the second conductive layer, or the fourth conductive layer, the first electrode and the electrode portion of the second semiconductor pattern are disposed to be staggered with the connection portion and the conductive pattern, wherein the first electrode and the electrode portion of the second semiconductor pattern have the same voltage, and the connection portion and the conductive pattern have another same voltage.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A pixel structure, comprising:
   a metal oxide semiconductor layer comprising a first semiconductor pattern and a second semiconductor pattern, wherein the first semiconductor pattern comprises a first doping region, a second doping region and a channel region, the first doping region and the second doping region are disposed respectively on two sides of the channel region, and the second semiconductor pattern comprises a contact portion and an electrode portion;
   a first insulating layer comprising a first gate insulation pattern and a first capacitance dielectric pattern, wherein the first gate insulation pattern is disposed on the first semiconductor pattern of the metal oxide semiconductor layer, and the first capacitance dielectric pattern is disposed on the second semiconductor pattern of the metal oxide semiconductor layer;
   a second insulating layer comprising a second gate insulation pattern and a second capacitance dielectric pattern, wherein the second gate insulation pattern is disposed on the first gate insulation pattern of the first insulating layer, and the second capacitance dielectric pattern is disposed on the first capacitance dielectric pattern of the first insulating layer;
   a first conductive layer comprising a gate and an electrode pattern, wherein the gate is disposed on the second gate insulation pattern of the second insulating layer, and the electrode pattern is disposed on the second capacitance dielectric pattern of the second insulating layer;
   a passivation layer covering the metal oxide semiconductor layer and the first conductive layer, and having a first opening through which the first doping region of the first semiconductor pattern is exposed, a second opening through which the second doping region of the first semiconductor pattern is exposed, a third opening through which the contact portion of the second semiconductor pattern is exposed, and a fourth opening through which the electrode pattern of the first conductive layer is exposed;
   a second conductive layer disposed on the passivation layer and comprising a first electrode, a second electrode and a second electrode extending portion connected with the second electrode; wherein: the first electrode is electrically connected to the first doping region of the first semiconductor pattern through the first opening; the second electrode is electrically connected to the second doping region of the first semiconductor pattern through the second opening; the second electrode is electrically connected to the contact portion of the second semiconductor pattern through the third opening; the gate, the first semiconductor pattern, the first electrode and the second electrode form an active element; the second semiconductor pattern partially overlaps the electrode pattern of the first conductive layer and is coupled with the electrode pattern of the first conductive layer to form a first storage capacitor; and the electrode pattern of the first conductive layer partially overlaps the second electrode extending portion and is coupled with the second electrode extending portion to form a second storage capacitor; and
   a pixel electrode electrically connected to the second electrode.

2. The pixel structure according to claim 1, wherein the passivation layer is an inorganic dielectric layer.

3. The pixel structure according to claim 1, wherein the second conductive layer further comprises a connection portion which is electrically connected to the electrode pattern of the first conductive layer through the fourth opening of the passivation layer.

4. The pixel structure according to claim 1, further comprising a conductive pattern disposed above the second semiconductor pattern and between the first capacitance dielectric pattern of the first insulating layer and the second capacitance dielectric pattern of the second insulating layer, wherein the second semiconductor pattern partially overlaps the conductive pattern and is coupled with the conductive pattern to form a third storage capacitor, and the conductive pattern partially overlaps the electrode pattern of the first conductive layer and is coupled with the electrode pattern of the first conductive layer to form a fourth storage capacitor.

5. The pixel structure according to claim 1, wherein the passivation layer is an organic dielectric layer.

6. The pixel structure according to claim 1, wherein the passivation layer is an organic planar layer.

7. A pixel structure, comprising:
   a metal oxide semiconductor layer comprising a first semiconductor pattern and a second semiconductor pattern, wherein the first semiconductor pattern comprises a first doping region, a second doping region and a channel region, the first doping region and the second doping region are disposed respectively on two sides of the channel region, and the second semiconductor pattern comprises a contact portion and an electrode portion;

a first insulating layer comprising a first gate insulation pattern and a first capacitance dielectric pattern, wherein the first gate insulation pattern is disposed on the first semiconductor pattern of the metal oxide semiconductor layer, and the first capacitance dielectric pattern is disposed on the second semiconductor pattern of the metal oxide semiconductor layer;

a second insulating layer comprising a second gate insulation pattern and a second capacitance dielectric pattern, wherein the second gate insulation pattern is disposed on the first gate insulation pattern of the first insulating layer, and the second capacitance dielectric pattern is disposed on the first capacitance dielectric pattern of the first insulating layer;

a conductive pattern disposed above the second semiconductor pattern and between the first capacitance dielectric pattern of the first insulating layer and the second capacitance dielectric pattern of the second insulating layer;

a first conductive layer comprising a gate and an electrode pattern, wherein the gate is disposed on the second gate insulation pattern of the second insulating layer, the electrode pattern is disposed on the second capacitance dielectric pattern of the second insulating layer, the first doping region and the second doping region of the first semiconductor pattern are exposed, and the contact portion of the second semiconductor pattern is exposed;

a passivation layer covering the metal oxide semiconductor layer and the first conductive layer and having a first opening through which the first doping region of the first semiconductor pattern is exposed, a second opening through which the second doping region of the first semiconductor pattern is exposed, a third opening through which the contact portion of the second semiconductor pattern is exposed, and fourth opening through which the electrode pattern of the first conductive layer is exposed;

a second conductive layer disposed on the passivation layer and comprising a first electrode and a second electrode, wherein the first electrode is electrically connected to the first doping region of the first semiconductor pattern through the first opening; the second electrode is electrically connected to the second doping region of the first semiconductor pattern through the second opening; the gate, the first semiconductor pattern, the first electrode and the second electrode form an active element; the second electrode is electrically connected to the contact portion of the second semiconductor pattern through the third opening; the second semiconductor pattern partially overlaps the conductive pattern and is coupled with the conductive pattern to form a storage capacitor; and the conductive pattern partially overlaps the electrode pattern of the first conductive layer and is coupled with the electrode pattern of the first conductive layer to form another storage capacitor; and a pixel electrode electrically connected to the second electrode.

8. The pixel structure according to claim 7, wherein the electrode pattern is electrically connected to the second electrode through the third opening.

9. The pixel structure according to claim 7, wherein the second conductive layer further comprises a second electrode connection portion, the second electrode connection portion electrically insulated from the second electrode, and the second electrode connection portion, the electrode pattern, the conductive pattern and the electrode portion of the second semiconductor pattern are partially overlapped, and the second electrode is electrically connected to the electrode pattern.

10. The pixel structure according to claim 7, wherein the passivation layer is an inorganic dielectric layer.

11. The pixel structure according to claim 7, wherein the passivation layer is an organic planar layer.

12. A layered structure usable for a pixel structure, comprising:

a metal oxide semiconductor layer comprising a first semiconductor pattern and a second semiconductor pattern, wherein the first semiconductor pattern comprises a first doping region, a second doping region and a channel region, the first doping region and the second doping region are disposed respectively on two sides of the channel region, and the second semiconductor pattern comprises a contact portion and an electrode portion;

a first conductive layer comprising a gate and an electrode pattern, wherein the gate is disposed above the first semiconductor pattern, and at least one gate insulation pattern is formed between the gate and the first semiconductor pattern; the electrode pattern is disposed above the second semiconductor pattern, and at least one capacitance dielectric pattern is formed between the electrode pattern and the second semiconductor pattern, such that the first doping region and the second doping region of the first semiconductor pattern are exposed, and the contact portion of the second semiconductor pattern is exposed;

a passivation layer covering the metal oxide semiconductor layer and the first conductive layer and having a first opening through which the first doping region of the first semiconductor pattern is exposed, a second opening through which the second doping region of the first semiconductor pattern is exposed, a third opening through which the contact portion is exposed, and a fourth opening through which the electrode pattern is exposed;

a second conductive layer disposed on the passivation layer and comprising a first electrode and a second electrode, wherein the first electrode is electrically connected to the first doping region of the first semiconductor pattern through the first opening; the second electrode is electrically connected to the second doping region of the first semiconductor pattern through the second opening; the gate of the first conductive layer, the first semiconductor pattern, the first electrode and the second electrode form an active element; the second electrode is electrically connected to the contact portion of the second semiconductor pattern through the third opening; and a pixel electrode electrically connected to the second electrode, wherein the second semiconductor pattern, the electrode pattern and the second electrode are formed in a partially overlapping mode to form at least two storage capacitors therebetween.

13. The layered structure according to claim 12, wherein the second conductive layer further comprises a connection portion which is electrically connected to the electrode pattern of the first conductive layer through the fourth opening of the passivation layer.

14. The layered structure according to claim 12, wherein the at least two storage capacitors comprise:
- a first storage capacitor formed by the second semiconductor pattern partially overlapping the electrode pattern of the first conductive layer; and
- a second storage capacitor formed by the second electrode partially overlapping the electrode pattern of the first conductive layer.

15. The layered structure according to claim 14, wherein the second electrode comprises a second electrode extending portion partially overlapping the electrode pattern of the first conductive layer, wherein the second storage capacitor is formed by the second electrode extending portion and at least a portion of the electrode pattern.

16. The layered structure according to claim 12, wherein the at least one gate insulation pattern formed between the gate and the first semiconductor pattern comprises a first gate insulation pattern disposed on the first semiconductor pattern, and a second gate insulation pattern disposed between the gate and the first gate insulation pattern; and wherein the at least one capacitance dielectric pattern formed between the electrode pattern and the second semiconductor pattern comprises a first capacitance dielectric pattern disposed on the second semiconductor pattern and a second capacitance dielectric pattern disposed between the electrode pattern and the first capacitance dielectric pattern.

17. The layered structure according to claim 16, further comprising a conductive pattern disposed above the second semiconductor pattern and between the first capacitance dielectric pattern and the second capacitance dielectric pattern, wherein the second semiconductor pattern partially overlaps the conductive pattern to form a third storage capacitor, and the conductive pattern partially overlaps the electrode pattern of the first conductive layer to form a fourth storage capacitor.

18. The layered structure according to claim 12, wherein the electrode pattern is electrically connected to the second electrode through the third opening.

19. The layered structure according to claim 12, wherein the passivation layer is an inorganic dielectric layer.

20. The layered structure according to claim 12, wherein the passivation layer is an organic planar layer.

* * * * *